US012693343B2

(12) United States Patent
Stephenson

(10) Patent No.: US 12,693,343 B2
(45) Date of Patent: Jul. 28, 2026

(54) METHOD AND CONTROL ARRANGEMENT FOR MASS SCALE PRODUCTION TESTING OF SECONDARY CELLS

(71) Applicant: Northvolt AB, Stockholm (SE)

(72) Inventor: Sean Stephenson, Bureå (SE)

(73) Assignee: Northvolt AB, Stockholm (SE)

( * ) Notice: Subject to any disclaimer, the term of this patent is extended or adjusted under 35 U.S.C. 154(b) by 370 days.

(21) Appl. No.: 18/423,536

(22) Filed: Jan. 26, 2024

(65) Prior Publication Data

US 2024/0255580 A1　Aug. 1, 2024

(30) Foreign Application Priority Data

Jan. 26, 2023　(SE) ................................... 2350071-3

(51) Int. Cl.
　G01R 31/385　(2019.01)
　G01R 31/01　(2020.01)
　G01R 31/36　(2020.01)
　G01R 31/367　(2019.01)
　G01R 31/392　(2019.01)
(52) U.S. Cl.
　CPC ..... G01R 31/3865 (2019.01); G01R 31/3647 (2019.01); G01R 31/3648 (2013.01); G01R 31/367 (2019.01); G01R 31/392 (2019.01); G01R 31/01 (2013.01)
(58) Field of Classification Search
　CPC .............. G01R 31/3865; G01R 31/392; G01R 31/3647; G01R 31/367; G01R 31/3648; G01R 31/01
　USPC ....................................................... 700/109
　See application file for complete search history.

(56) References Cited

U.S. PATENT DOCUMENTS

2022/0404430 A1* 12/2022 Salvador .............. G01R 31/367
2022/0404431 A1* 12/2022 Salvador ............ G01N 33/0027

FOREIGN PATENT DOCUMENTS

WO　　2021-113879 A2　6/2021

OTHER PUBLICATIONS

"Towards a smarter battery management system: A critical review on battery state of health monitoring device" Published by Elsevier (Year: 2018).*
Search Report for Swedish Application No. 2350071.3, dated Aug. 8, 2023, (6 pages), Swedish Patent and Registration Office, Stockholm, Sweden.

* cited by examiner

*Primary Examiner* — Zeina Elchanti
(74) *Attorney, Agent, or Firm* — Zilka-Kotab, P.C.

(57) ABSTRACT

The present disclosure pertains to testing of rechargeable cells for use in batteries arranged in electrical vehicles. According to a first aspect the disclosure relates to method for evaluating cell health of secondary cells 1 in mass scale production testing. The method comprises obtaining manufacturing data (i.e. data analysis 41) and generating scanning data by scanning 42 an inside of the secondary cells. The method further comprises determining cell quality using a prediction algorithm, performing additional testing 43 on a selection of the scanned secondary cells and verifying, based on the additional testing, accuracy of the prediction algorithm. The method thereafter comprises evaluating cell health of the individual cells 1 based on the cell quality determined using the prediction algorithm. The disclosure also relates to a corresponding control arrangement.

14 Claims, 5 Drawing Sheets

PRIOR ART

METHOD AND CONTROL ARRANGEMENT FOR MASS SCALE PRODUCTION TESTING OF SECONDARY CELLS

CROSS REFERENCE TO RELATED APPLICATIONS

This application claims priority to and the benefit of Swedish Patent Application No. 2350071-3, filed Jan. 26, 2023; the contents of which as are hereby incorporated by reference in their entirety.

TECHNICAL FIELD

The present disclosure pertains to testing of rechargeable cells, commonly called secondary cells, for use in batteries arranged in electrical vehicles. More specifically, the disclosure relates to a method for mass scale production testing of secondary cells and to a corresponding control arrangement.

BACKGROUND

In addressing climate change there is an increasing demand for rechargeable batteries, for example to enable electrification of transportation and to supplement renewable energy. Currently, lithium-ion batteries are becoming increasingly popular. Lithium-ion batteries represent a type of rechargeable battery in which lithium ions move from the negative electrode to the positive electrode during discharge and back when charging.

A rechargeable battery, also referred to as a secondary battery, comprises one or more secondary cells, herein also referred to as simply "cells". During production of secondary cells, test procedures are performed in order to reveal essential characteristics of the lithium-ion cells regarding capacity, power density, energy density, storage life and cycle life. These tests are commonly referred to as Performance and Lifecycle, P&L, tests.

FIG. 1 illustrates a P&L test environment that is commonly used today. In the illustrated setup testing is performed by attaching secondary cells placed in a controlled test environment, such as in a temperature chamber 200, to a cycler 30 placed next to the temperature chamber 200, as illustrated in FIG. 1. Cyclers 30 are basically battery testers commonly used to analyse cell health by analyzing cell responses of the cells over time during charge/discharge cycles. During cell cycling, a number of parameters can be measured, including capacity, temperature, current, voltage, efficiency of the battery and self-discharge. The cyclers 30 are being designed and modelled to discharge and recharge one or more cells (in the range of 100-1000 Ah) at full current. Capacity of a setup comprising one or more cyclers 30 and a temperature chamber 200 is typically less than 100 cells.

Due to mass scale production, it is foreseen that within a near future mass scale P&L testing will be required at the manufacturing site. This will generate new demands on the P&L testing, such as equipment efficiency, footprint in factory, energy efficiency, installation time and cost. Current P&L facilities are seriously under-dimensioned to meet predicted needs of mass scale cell production. Hence, there is a need for improved methods that enable and facilitate mass scale P&L testing.

SUMMARY

It is an object of this disclosure to present alternative methods that can be used for production testing of secondary cells in order to handle increasing cell volumes. This is achieved by the proposed method and control arrangement.

According to a first aspect the disclosure relates to method for evaluating cell health of secondary cells in mass scale production testing. The method comprises obtaining, during cell manufacturing, manufacturing data associated with the secondary cells, and, upon the cells being fully assembled, generating scanning data by scanning an inside of, at least a subset of the secondary cells using a radiation-based scanning technology. The method further comprises determining cell quality of the individual secondary cells using a prediction algorithm that predicts cell quality based on obtained manufacturing data and/or the generated scanning data, performing additional testing using a testing technology having higher reliability than the radiation-based scanning technology on a selection of the scanned secondary cells, and verifying, based on the additional testing, that accuracy of the prediction algorithm meets accuracy requirements that must be met in order for the determined cell quality to form a basis for production testing. The method then comprises evaluating cell health of the individual cells based on the cell quality determined using the prediction algorithm. By adding data and radiation-based test methods in production testing, the number of cells that need to undergo additional testing can be reduced, as test quality determined using a prediction algorithm will form a basis for evaluating cell health. The electrical testing used today will thereby only serve as a complement used to verify accuracy of the prediction. Hence, the proposed method, it is possible to provide increased testing capacity without expansion of capacity for additional testing, such as electrical testing, as capacity of scanning is typically much higher than capacity for electrical testing.

In some embodiments, the prediction algorithm comprises criteria applicable to identify, based on the scanning data, internal changes in secondary cells associated with cell degradation and/or different types of errors. By applying statistical models to manufacturing data, it is possible to trace deviations to a certain manufacturing step (e.g., slurry production). In this way, deviations in manufacturing that risk impacting cell life or safety can be detected.

In some embodiments, the prediction algorithm comprises criteria applicable to detect, based on the manufacturing data, potential manufacturing deviations associated with cell degradation and/or different types of errors. By using sensing technologies, cell health or individual problems of fully assembled cells can be detected or predicted.

In some embodiments, the obtained manufacturing data comprises data collected during slurry production and/or during electrode coating. By analysing manufacturing data from various manufacturing steps, a variety of deviations in manufacturing that may cause errors can be detected.

In some embodiments, the scanning is performed a predetermined time after cells being fully formatted. Thereby, faulty scanning results caused by gas in the cells may be avoided.

In some embodiments, the scanning is performed by a scanner arranged at a production line. Hence, the scanning may be introduced as a very last step of the production line, which is feasible for testing large cell volumes.

In some embodiments, cells selected to undergo additional testing are side streamed on another line, different from the production line. Hence, testing may be completely automated.

In some embodiments, the selection of secondary cells selected for additional testing comprises high performing cells having scanning results exceeding an acceptance level for passing with a certain margin. In some embodiments, the selection of secondary cells selected for additional testing comprises outliers having scanning results within a certain interval from the acceptance level for passing. In some embodiments, acceptance level for passing, failing cells having scanning data failing to meet the acceptance level for passing with a certain margin. In some embodiments, suspicious cells having deviating manufacturing data. By performing additional testing on cells of different cell quality, quality of the error detection algorithm can be ascertained.

In some embodiments, the verifying comprises comparing determined cell quality with cell quality determined based on the additional testing. By comparing test results obtained using different technologies, the accuracy of the technologies, and associated algorithms, may be evaluated.

In some embodiments, the method comprises updating the prediction algorithm based on cell quality. By continually improving the algorithm the accuracy of the prediction algorithm may be enhanced In some embodiments, the verifying comprises investigating consequences of deviations in the obtained manufacturing data. The additional testing can also be used to follow up suspicious manufacturing data. In this way, the usefulness of manufacturing data as a means to determine cell quality may be further improved.

In some embodiments, the radiation-based scanning technology comprises sound, such as ultrasound or echo sound. Hence, various technologies can be used to scan the inside of the cells based on availability.

In some embodiments, the method comprises developing a prediction algorithm based on results from additional testing of secondary cells of different cell quality. Existing and new prediction methods may be developed by scanning cells containing intentional defects, as well as healthy cells, and analysing the scanning data.

In some embodiments, the additional testing comprises one or more of; cell cycling, short circuit testing, over charging testing, nail penetration testing, thermal testing, or CT-scanning. Hence, various testing methods may be used in combination with the scanning methods.

According to a second aspect, the disclosure relates to a control arrangement configured to perform the methods according to the first aspect.

According to a third aspect, the disclosure relates to a computer program comprising instructions which, when the program is executed by a computer, cause the computer to carry out the method according to the first aspect.

According to a fourth aspect, the disclosure relates to a computer-readable medium comprising instructions which, when executed by a computer, cause the computer to carry out the method according to the first aspect.

BRIEF DESCRIPTION OF THE DRAWINGS

The embodiments disclosed herein are illustrated by way of example, and by not by way of limitation, in the figures of the accompanying drawings. Like reference numerals refer to corresponding parts throughout the drawings, in which.

DETAILED DESCRIPTION

To solve problems associated with battery degradation and failures during usage, radiation-based scanning techniques based on ultrasound have been developed. With these techniques monitoring is typically performed using a transceiver that is attached to the external surfaces of a secondary cell. One example of scanning using ultrasound is disclosed in B. Sood, M. Osterman and M. Pecht, "Health monitoring of lithium-ion batteries," 2013 IEEE Symposium on Product Compliance Engineering (ISPCE), 2013, pp. 1-6, doi: 10.1109/ISPCE.2013.6664165.

This disclosure proposes a production testing framework that integrates radiation-based scanning in production testing in order to reduce the need for expensive and time-consuming techniques, such as electrical testing and disassembly and CT scanning. More specifically, the proposed technique is based on the insight that data from the radiation-based scanning can, together with analysis of manufacturing data, be used to predict cell quality. This has been ascertained by tests showing that such prediction can be accurate enough to replace electrical testing used today. A method is therefore proposed, which comprises evaluating cell health based on cell quality predicted based on radiation-based scanning and manufacturing data. In the proposed method additional testing of higher reliability, such as electrical testing, is only used as a complement to assure quality and performance of the less expensive and time-consuming scanning and data analysis.

Figure 2:
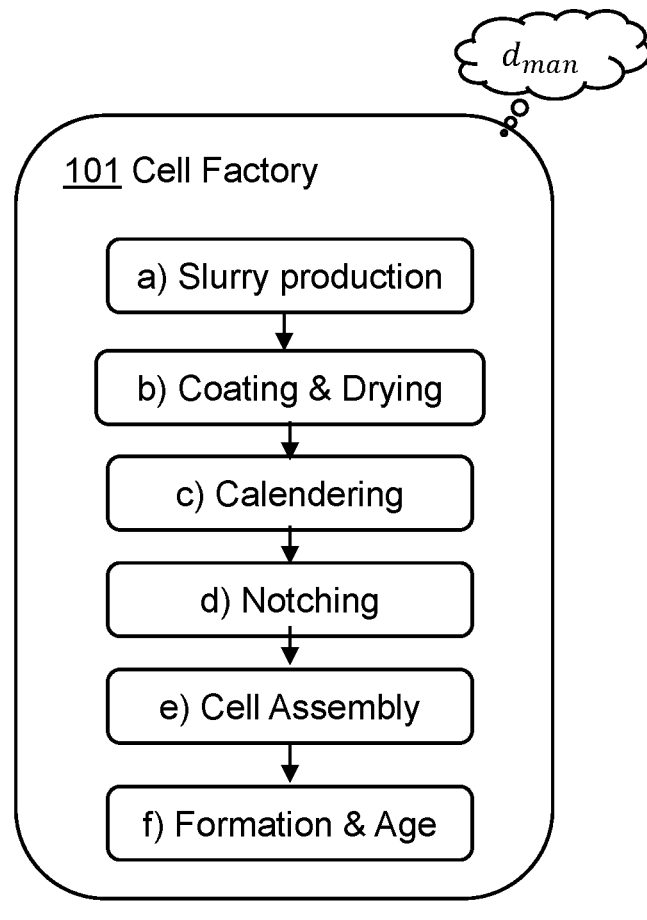
FIG. 2 illustrates the main steps of the cell manufacturing process.

For better understanding of the proposed technique cell manufacturing and associated problems will first be briefly described. Cell manufacturing is a complicated procedure involving many steps, where something may go wrong. FIG. 2 illustrates some main steps of cell manufacturing process 101 in further detail. In step a), electrode slurry is produced. The slurry is a dispersion composed of conductive additives, polymer binders, and electrochemically active material particles that serve as reservoirs for lithium. The slurry is then coated onto conductive substrates and dried to form porous electrodes, step b). In the calendering, step c), the electrodes are compressed by passing through pairs of heated rolls, called calenders. Thereafter, notches or electrode tabs are formed along long sides of the electrode sheets, step d). The electrode tabs are used for forming and/or attaching the terminals of the cell. The cells are then assembled, step e). More specifically, the electrode sheets are rolled with an isolating layer in-between and inserted into enclosures that are filled with electrolyte before they are sealed. The Formation and Aging, F&A, process step f), is the last step in the cell manufacturing process. In F&A the cells 1 go through a series of charging, discharging and aging cycles to activate the working materials and evaluate the cells performance.

In all the steps, manufacturing data $d_{man}$ may be collected and saved. In manufacturing, data may not be assigned to individual cells, but rather to batches of cells or battery packs. For example, various data is collected in the slurry production process (step a). The manufacturing data $d_{man}$ is typically stored by the manufacturer and may involve various data such as sensor measurements (temperature, humidity, conductivity etc.), staff data, hardware data (e.g., machine identification data), time data, etc. When cells 1 are produced, the slurry batch used is registered together with cell identifiers for traceability. Some manufacturing data, such as F&A data may be registered for individual cells. The data from the various steps comprises information that is valuable when evaluating why an individual cell is not performing as expected, as it may indicate deviations in the manufacturing process.

Figure 3:
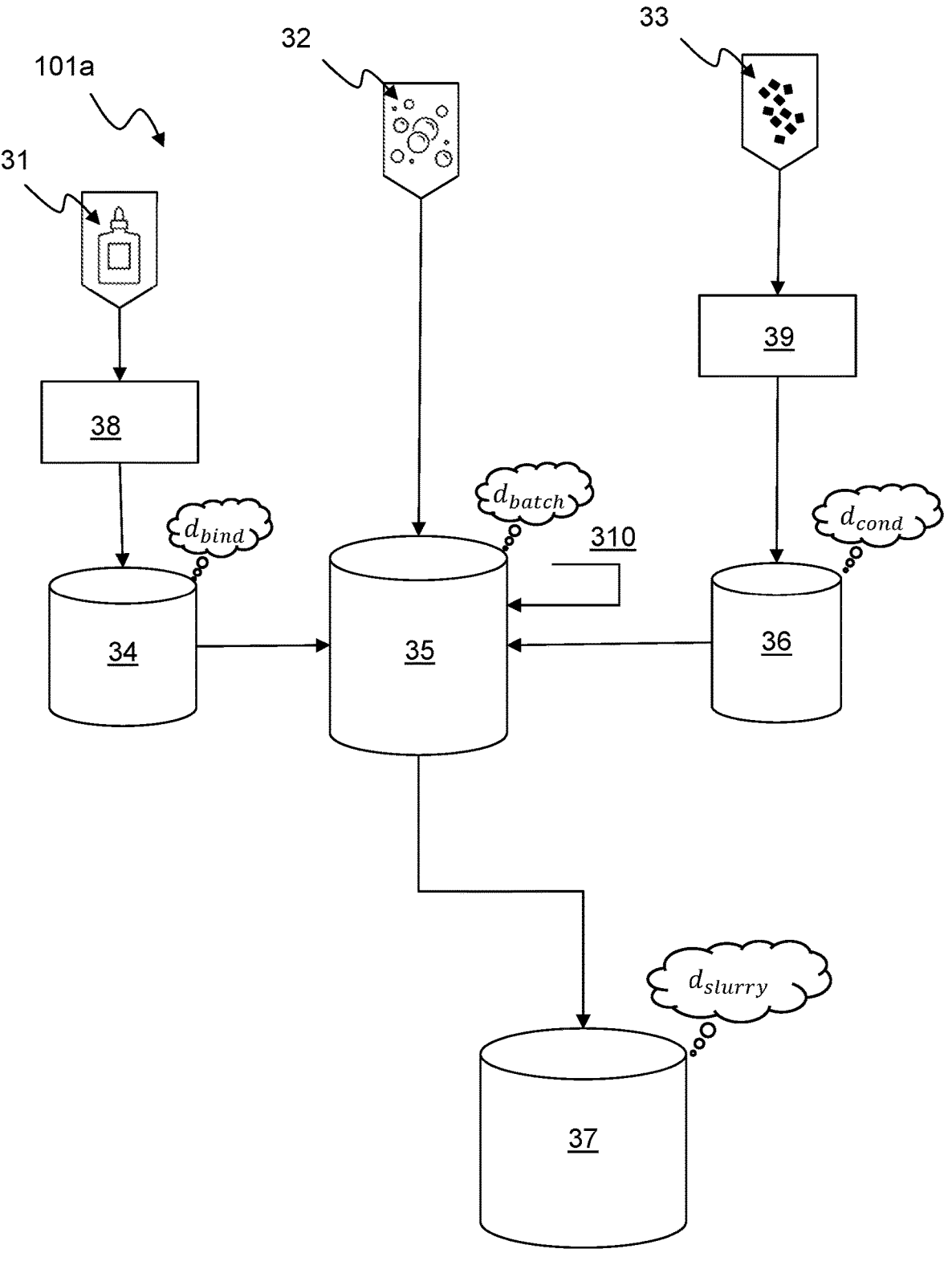
FIG. 3 illustrates the slurry production process of step a) in FIG. 2 in further detail.

FIG. 3 illustrates the slurry production process (step 101$a$ in FIG. 2) in further detail. Slurry production is a part of the cell manufacturing process that involves several steps and has been identified as a source of risk for State-of-Health, SOH. Slurry production is therefore conceptually illustrated for better understanding of sources of potential cell failure and to illustrate how manufacturing data $d_{man}$ can be collected to detect such failures. The main raw material of the electrode slurry is the active component (or powder) containing lithium ions. In the slurry production process, the active component is mixed with other raw material such as binder and conductive material (e.g., carbon). For each raw material there may be a loading step, a mixing step and possibly also a buffer step.

FIG. 3 illustrates how the raw materials are first loaded in individual hoppers. In this simplified figure there is only one hopper per raw material, i.e., one binder powder hopper 31, one active powder hopper 32 and one conductive powder hopper 33, but in a real implementation several hoppers may be used for each raw material. There may also be different types of the raw materials, such as different types of binder powder. The binder powder and conductive powder are mixed (with a solvent 310) in respective mixers (binder mixer 38 and conductive mixer 39) to produce binder and conductive paste. After the mixers there is typically a respective buffer step 34, 36, where binder and conductive paste is stored. In these intermediate buffers 34, 36 data $d_{bind}$, $d_{cond}$ may be collected.

The slurry is then produced by mixing agent powder with binder and conductive paste (and possibly solvent 310) in a slurry mixer 35. Various data $d_{batch}$, may be recorded at the slurry mixer 35. If there are several slurry mixers 35, an identity of the mixer may also be recorded and stored. In addition, data associated with staff and hardware involved in the slurry production may be registered.

The produced slurry is then stored in one or more intermediate slurry storages 37 before it is applied to electrode sheets. In the storage further data $d_{slurry}$ may be recorded.

Throughout the slurry production process data is recorded and mapped to one or more batches. A batch may be defined in different ways. For example, a batch of slurry is the accumulative sum of slurry found in a storage after a refilling from the minimum to the maximum level before any consumption from the storage. However, a batch may also refer to the slurry being mixed as a batch in a mixer. Same applies to a batch of binder or conductive paste. With that said, each cell may be associated with one or more batches, depending on what slurry was used to produce the electrodes. During manufacturing each cell is uniquely identified and relevant batches are registered, such that corresponding manufacturing data $d_{batch}$ can be collected at a later point in time.

Manufacturing data $d_{man}$ that may be recorded include, but is not limited to, composition, chemical properties, conductivity, weight, level, storing time, temperature, humidity, etc. In addition, data associated with staff and hardware involved in the process may be registered.

The proposed production testing framework will now be briefly described with reference to FIG. 4. The framework includes three types of evaluation techniques. The evaluation techniques include manufacturing data analysis 41, scanning methods 42 and additional testing 43. The manufacturing data analysis 41 basically involves applying statistical models, for example regression models, on the manufacturing data $d_{man}$ collected during manufacturing (FIG. 2). As the manufacturing data $d_{man}$ is typically available already in existing factories, it does not require any additional measure but analyzing the data.

The scanning methods 42, or sensing methods, includes radiation-based scanning technologies, which are typically faster (seconds or minutes) than electrical testing or physical destructive tests (i.e., tear down or force faulting cell), which might take days. Examples of scanning techniques are ultrasonic methods and echo testing. Due to its speed, it is anticipated that this type of scanning in the future may be implemented in a production line, see FIG. 5, where scanners 51 are arranged to test cells 1 in a production line 50. If the scanning is implemented in the production line, in may be possible to scan up to 100% of all produced cells.

The scanning methods 42 enables determination of cell health of individual cells based on a prediction algorithm that evaluates cell health of individual cells based on the scanning results. The prediction algorithm may also involve manufacturing data analysis 41 of manufacturing data attributed to the cell.

Figure 1:
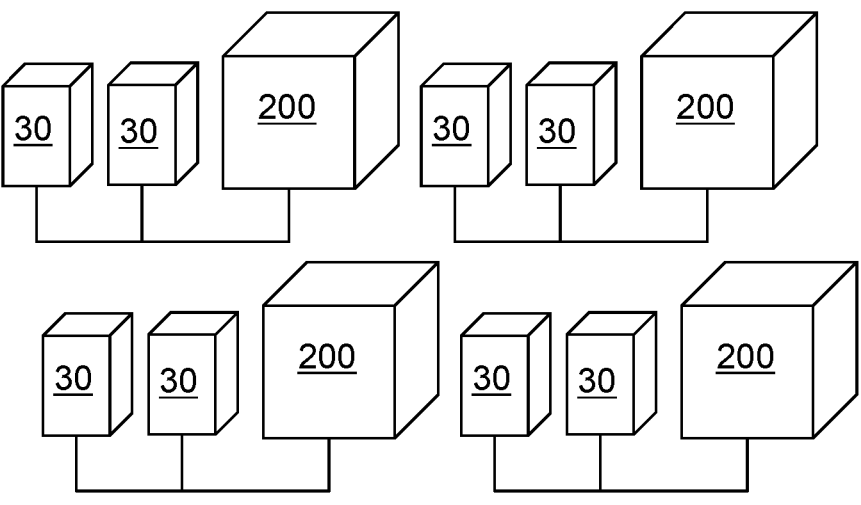
FIG. 1 illustrates P&L testing of secondary cells according to prior art.

The additional testing 43 is testing that is more reliable than the scanning methods 42. In some embodiments, the additional testing 43, refers to techniques that require electrical connection or physical interaction with the cells. Examples of additional testing 43 comprises cell cycling short circuit testing, over charging testing, nail penetration testing, thermal testing, or CT-scanning. These types of additional high-reliability testing 43 differs from radiation-based scanning in that it is time consuming, power consuming and is typically performed in a separate testing facility (FIG. 1). Electrical testing is frequently used today but is insufficient for mass scale testing due to lack of capacity.

Figures 4, 5:
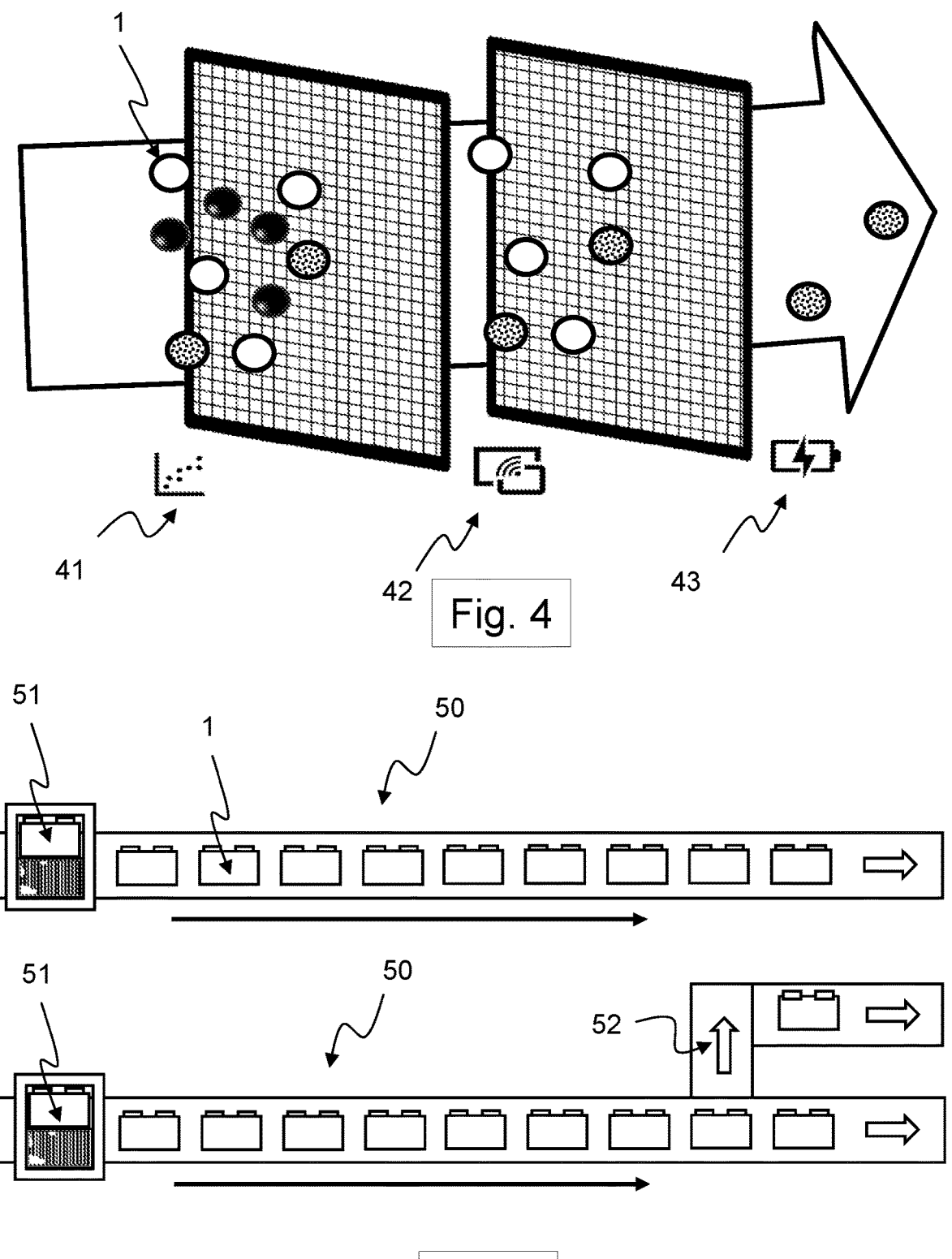
FIG. 4 illustrates the concept of introducing new test methods in production testing.
FIG. 5 illustrates how the proposed technique can be implemented in a cell production line.

FIG. 4 illustrates how the number of cells that undergo testing is reduced for each evaluation technique 41, 42, 43, so that fewer cells 1 are tested using the most time-consuming technique. More specifically data analysis can be performed for all cells, as data is typically readily available for all cells 1. However, scanning may only be performed on a subset of the cells 1. In the illustrated example, the cells (black) are filtered out and are not tested using scanning methods 42. The subset may be selected in various ways, such as depending on implementation. For example, it may be that the scanners 51 (see FIG. 5 below) are not fast enough to scan all cells, but maybe only every second cell may be scanned. The at-line or in-line scanning is typically done by parts per minute. Hence, it may be difficult for the scan to keep up if for example the line operates at 13 parts per minute, but the scan can only do 10 parts per minute. However, in some embodiments, all cells undergo scanning.

FIG. 4 further illustrates that only a selection of cells (dotted) undergo additional testing 43. The selection may be selected based on results from the scanning methods 42. If the purpose is to evaluate the prediction algorithm, then the selection may be selected to embrace cells with different predicted cell quality to enable verification of the entire range of the algorithm. However, in addition, the additional testing may be used as a backup in cases where results from data analysis 41 and scanning methods are contradictory or vague, e.g., where predicted cell quality is close to an acceptance level. In such cases it may be desirable to perform additional testing, including CT scans, tear downs or other methods of destructive tests, to get a more reliable result on cells 1 with prediction results that are difficult to interpret.

FIG. 5 illustrates how the proposed technique can be implemented in production lines 50 of a cell factory. In each production line 50 a scanner 51 is arranged to test cells in the production. In some embodiments the scanners 51 are arranged at the end of the production line, such as after a second, or final, formation step. In other words, the scanning may be performed on fully formed cells. In other embodiments, the scanning is alternatively, or in addition performed before formation.

In some embodiments, the cells arrive at the scanners 51 loaded in trays. If the scanning uses ultrasound, probes are typically attached to the enclosure of the cells 1 during the scanning. The scanning may take place in a separate compartment. In some embodiments, a robot is arranged to move individual cells 1 (e.g. using a gripper) to the separate compartment for testing, and back to the production line after testing.

The proportion of cells 1 being tested depends on the time required to scan one cell. In the lower line cells 1 some cells are side streamed to a separate line 52 to off-line labs to be diagnosed with CT scanners, tear down, destructive tests or other type of high-resolution sensing methods (herein referred to as additional testing) to confirm or deny results of the scanner 51. The robot may be used to put the selected cells on the separate line. The offline labs may be located in another room or building.

In normal operation, when new cells 1 are arriving continually on the production line, the process may be automated. In other words, the robot may pick cells (or trays) arriving on the production line and automatically insert them into the scanner(s) 51. After testing cells are put back on the production line 51. A selection of cells 1 may be side streamed to a separate tray or line 52. If the scanning is configured to reveal different types of problems, such as capacity problems and defects, faulty cells 1 may be side streamed and in addition be sorted based on type of error/problem. It shall be noted that even healthy cells may be side streamed for further testing in order to prove accuracy of the scanning results, as explained above and below.

If production is stopped, such as issues with a conveyer, the scanner may be configurable to operate in a manual mode. In the manual mode, an operator can control the scanner 51 (and potentially also the robot, to test cells. In other words, the scanners 51 are configurable to work in a stand-alone mode in certain situations, such as when a conveyance system is stopped, or being under installation. This may typically require that the scanners 51 are installed in a way such that they can be manually loaded/unloaded as well as operated. This issue may be resolved by assuring that there is enough space around the scanners 51. Alternatively, the scanners 51 may be movably installed, such that they can be moved when operated in the manual mode.

Figure 6:
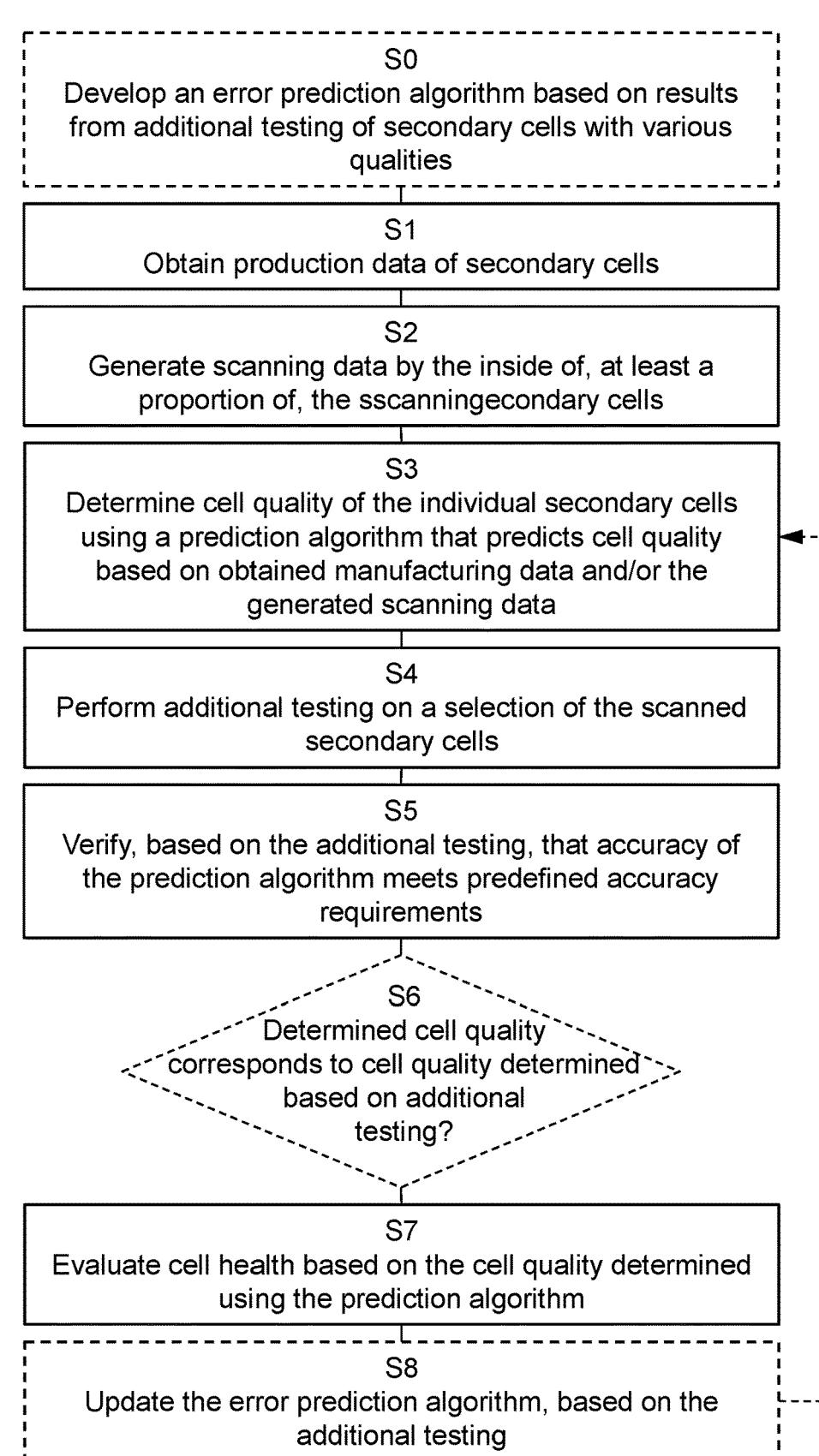
FIG. 6 illustrates the proposed method for evaluating cell health of secondary cells in mass scale production testing.

The proposed method evaluating cell health of secondary cells 1 in mass scale production testing will now be described with reference to the flow chart of FIG. 6 and reference to the other figures. The method is performed, at least partly, by a control arrangement 10. The method may be implemented as a computer program comprising instructions which, when the program is executed by a computer (e.g., a processor in the control arrangement 10 (FIG. 7)), cause the computer to carry out the method by means of test equipment such as cyclers 30 (FIG. 1) and scanners 51 (FIG.

5). However, some steps may involve manual interaction, such as moving the cells 1 to a test chamber 200 (FIG. 1) or manually starting tests. According to some embodiments the computer program is stored in a computer-readable medium (e.g., a memory or a compact disc) that comprises instructions which, when executed by a computer, cause the computer to carry out the method.

The method uses a prediction algorithm that predicts cell quality based on obtained manufacturing data $d_{prod}$ and/or the generated scanning data $d_{scan}$. Such a prediction algorithm is developed before the actual testing starts. The prediction algorithm is typically developed in a lab, for example by training a model based on scanning results of cells with confirmed quality. Quality may be confirmed based on disassembly, electrical testing or based on error reports from cells used in vehicles. In other words, in some embodiments, the method comprises developing S0 the prediction algorithm based on results from additional testing of secondary cells of different cell quality. The prediction algorithm may include a combination of rules, criteria, and models applicable to the obtained manufacturing data $d_{prod}$ and/or the generated scanning data $d_{scan}$.

For example, the prediction algorithm may define criteria that can be applied when analysing scanning data $d_{scan}$ to determine whether a certain failure or problem is likely to be present or not. For example, because failure may be determined based on material properties, the criteria may be associated with amplitude or Time-Of-Flight, TOF, of an ultrasonic response signal. In other words, in some embodiments, the prediction algorithm comprises criteria applicable to identify, based on the scanning data, internal changes in secondary cells associated with cell degradation and/or different types of errors. There may be different criteria associated with different types of problems, or general criteria associated with a general cell quality.

In some embodiments, the prediction algorithm takes age of the cell 1 as input. The reason is that cell age may affect the scanning results. Hence, when evaluating the scanning results, age of the scanned cell 1 may be taken into consideration in order to determine what is normal, or indication of an error. This means that the prediction model should also be trained on cells 1 of different ages. There may also be other parameters, such as manufacturing parameters that may be taken into account by the prediction algorithm.

In some embodiments, the prediction algorithm may be tuned to detect different types of errors. For example, the algorithm may first analyse capacity and additionally, or alternatively, perform error detection.

The prediction algorithm may also define criteria that can be applied when analysing the obtained manufacturing data $d_{man}$. Manufacturing data $d_{man}$ may give further information about the manufacturing process. The information may be used to predict deficiencies in cells. The obtained manufacturing data $d_{man}$ may include parameters such as open-circuit voltage, electrical measurement from formation (such as direct current internal resistance), capacity as predictor of cycle life, sheet thickness of anode and cathode, amount of electrolyte. In some embodiments, the prediction algorithm comprises criteria applicable to detect, based on the manufacturing data $d_{man}$, potential manufacturing deviations associated with cell degradation and/or different types of errors. For example, the criteria may involve statistical models that takes a variety of parameters as input. These statistical models may be trained to identify scenarios that historically has resulted in production problems. The ranges of parameters that may be analysed is huge and the impact of an individual parameter may not be readily interpreted.

However, when a large amount of data is analysed, small deviations in several parameters may indicate a failure.

The prediction algorithm may comprise a regression model. The prediction algorithm may be developed based on so called "golden cells", which are cells of exceptional performance. The performance may be verified by disassembly, cycling and data from use in vehicles. Data patterns i.e. manufacturing data $d_{man}$, of golden cells may be used as a reference of the prediction algorithm. The amount of deviation from data patterns of the golden cells may be used as a measure of cell quality, where an insignificant deviation corresponds to a good cell. Large deviations may indicate fault that needs further analysis.

As described above, the method is based on analysing manufacturing data $d_{man}$ recorded during cell manufacturing. In other words, the method comprising obtaining S1 manufacturing data $d_{man}$, recorded during cell manufacturing, associated with the secondary cells 1. This step basically means that manufacturing data $d_{man}$ is retrieved from the cell factory. The manufacturing data may include data from slurry production, cell coating, F&A, etc. In other words, in some embodiments, the obtained manufacturing data $d_{man}$ comprises data collected during Formation and Ageing, F&A, slurry production and/or during electrode coating.

The method is further based on scanning data $d_{scan}$. Scanning is performed on fully assembled cells, for example as a last step in the production line 50 (FIG. 5). Scanning may be performed on pre-formed cells or fully formed cells. In other words, the method further comprises, upon the secondary cells 1 being fully assembled, generating S2 scanning data $d_{scan}$ by scanning an inside of, at least a subset of the secondary cells 1 using a radiation-based scanning technology. Various radiation-based scanning technologies may be used, such as ultrasound or echo sound.

During formation gas is accumulated inside the cells 1, which may distort the scanning results. This may be resolved by scanning the cells before formation. However, this may be disadvantageous as the cells are not complete and problems occurring during formation will not be detected. An alternative is to wait a predetermined amount of time after formation before performing the scanning. In other words, in some embodiments the scanning S2 is performed a predetermined time after a last (typically second) formation step. The predetermined time may be in the range of hours or even days, such as 24 hours. However, depending on the formation and aging process it may also be shorter, such as minutes. The predetermined time depend on various factors such as the type of cells and where the probes are attached, as the gas slowly propagate towards the middle of the cells.

Thereafter cell quality may be determined, or predicted, based on the manufacturing data $d_{man}$ and/or the generated scanning data $d_{scan}$. The prediction is based on available sensing technologies, which may be combined with knowledge from the manufacturing. For example, if the scanning data $d_{scan}$ reveals a deviation, the algorithm goes back to manufacturing data $d_{man}$. For example, F&A tests may first be analyzed to see if some results are on the border to failing. If F&A data looks "suspicious", e.g., including values deviating from normality (e.g., high temperature) or being within a certain interval from acceptance levels (close to failing), the slurry data of a batch to which the cell belongs may also be checked. If the manufacturing data $d_{man}$ looks suspicious this confirms that the quality of the cell 1 is low. However, if there are nothing suspicious in manufacturing data $d_{man}$, then the deviation may be neglected. Hence, the method comprises determining S3 cell quality of the individual secondary cells using a prediction algorithm that predicts cell quality based on obtained manufacturing data $d_{man}$ and/or the generated scanning data $d_{scan}$. In other words, in some embodiments, cell quality is solely based on the scanning results. In other embodiments, the determining S3 is also based on the manufacturing data $d_{man}$. In other embodiments, the manufacturing data $d_{man}$ is used as input to the prediction algorithm. Cell quality may be predicted based on the obtained manufacturing data $d_{man}$ and the generated scanning data $d_{scan}$. However, in certain cases it may be enough to consider either obtained manufacturing data $d_{man}$ or the generated scanning data $d_{scan}$. For example, scanning may not be performed on all cells, but on every second. Then, it may be enough to rely on manufacturing data $d_{man}$, as cells of the same batch typically have the same quality. For example, for one batch manufacturing data $d_{man}$ is analysed for all cells, whereas scanning is performed on 50%, while additional testing (step S4 below) is only performed on 1% of the cells. If all results are pass testing requirements, then all cells have passed testing.

Another option is that prediction is mainly based on the scanning data $d_{scan}$, whereas manufacturing data $d_{man}$ is analysed if the scanning data $d_{scan}$ do not meet certain criteria. If all cells do not undergo testing, then cell quality may have to be determined only based on production data. For a cell having certain production data, the cell quality may then be determined based on the production data. For example, it may be assumed that cells with similar production data have similar cell quality.

A selection of cells is thereafter selected to undergo additional testing. As the purpose of the additional testing is mainly to verify accuracy of the prediction, it is typically desirable to select cells 1 having different cell quality. In this way the prediction algorithm is evaluated for different data.

It may be desirable to test some cells that are expected to be really high performing. Hence, in some embodiments, the selection of secondary cells 1 selected for additional testing comprises high performing cells having scanning data $d_{scan}$ and/or manufacturing data $d_{man}$ exceeding acceptance levels for passing with a certain margin.

It may also be relevant to test cells that only barely pass the production testing. Hence, in some embodiments, the selection of secondary cells 1 selected for additional testing comprises outliers having scanning data $d_{scan}$ and/or manufacturing data $d_{man}$ within a risk interval just above the acceptance level for passing.

It may also be relevant to verify that cells that would fail production testing when tested using the prediction algorithm are actually faulty. In some embodiments, the selection of secondary cells 1 selected for additional testing comprises failing cells having scanning data $d_{scan}$ and/or manufacturing data $d_{man}$ failing to meet the acceptance level for passing with a certain margin.

Finally, it may be needed to test cells for which it is difficult (or even impossible) to determine cell quality with the prediction algorithm. This may be the case if the scanning and the manufacturing data do not indicate similar cell quality. For example, scanning looks suspicious, but manufacturing data indicate that everything is in order. Hence, in some embodiments, the selection of secondary cells 1 selected for additional testing comprises suspicious cells having deviating manufacturing data $d_{man}$.

Once the selection is made, additional testing is performed. This may involve moving the selected cells to another facility or to another room, compartment, or enclosure. Hence, the method comprises performing S4 additional testing using a testing technology having higher reliability than the radiation-based scanning technology on a selection of the scanned secondary cells 1. Test results from the additional testing are then used to verify that determination of cell quality performed using the prediction algorithm is within specifications for production testing. Specifications may require that the determined cell quality corresponds to results of electrical testing for a certain percentage of the cells, such as for 99.X % of the cells (where X=0-9). In other words, the method comprises verifying S5, based on the additional testing, that accuracy of the prediction algorithm meets predefined accuracy requirements that must be met in order for the determined cell quality to form a basis for production testing.

The verification may basically imply that results from the different methods are compared, which means that the proposed method will give the same result as if e.g. electrical testing were performed on all cells. In some embodiments, the verifying S5 comprises comparing determined cell quality with cell quality determined based on the additional testing.

The verification may also involve investigating consequences of any suspicious behaviour identified in the determining S3. For example, if for one cell the scanning indicates a failure, but manufacturing data looks good, then this cell may be selected for additional testing. In some embodiments, the verifying S5 comprises investigating consequences of deviations in the obtained S1 manufacturing data. On the other hand, if both scanning data and manufacturing data indicate that there is something wrong, this may be enough to determine that cell quality is insufficient. The same goes if both scanning data and manufacturing data looks good.

After verifying accuracy of the prediction algorithm, the scanning can replace the additional testing to determine that individual cells have sufficiently high quality to be put on the market. In other words, the method comprises evaluating S7 cell health of the individual secondary cells 1 based on the cell quality determined using the prediction algorithm.

To avoid that faulty cells are put on the market, the evaluation of cell health may in some embodiments only be based on the prediction algorithm when it has been verified that the accuracy is high enough, i.e., if determined cell quality corresponds to cell quality determined based on for example electrical testing (step S6). If this is the case, electrical testing or similar may be used as a fall-back solution. In other words, in some embodiments, the method comprises evaluating S7 cell health of the individual secondary cells 1 based on the cell quality determined using the prediction algorithm upon a deviation between the determined cell quality and cell quality determined based on additional testing exceeds a predetermined level. Alternatively, production testing may be stopped if verification reveals that accuracy of the prediction results is insufficient.

To further improve testing accuracy the prediction algorithm may be further improved as testing proceeds, or if it has been stopped due to inaccuracy in the prediction algorithm. Typically, the goal is that results from the prediction algorithm should be as accurate as possible. Hence, test results from previous tests may be used to train the prediction algorithm. In other words, in some embodiments, the method comprises updating S8 the prediction algorithm based on cell quality. Over time, the prediction algorithm may also be updated based on data from cells 1 that are installed in vehicles 1. For example, a definition of a "golden cell" may change as more tests are performed with improved results. Hence, the prediction algorithm may be dynamic.

Figure 7:
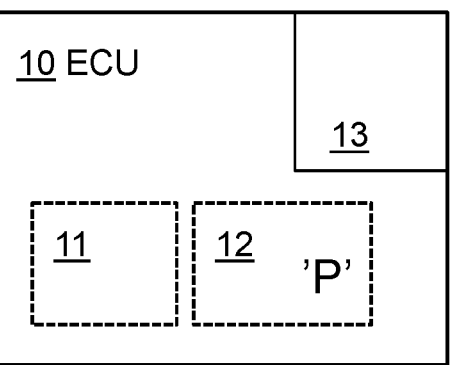
FIG. 7 illustrates a control arrangement configure to perform the proposed method.

FIG. 7 illustrates a control arrangement 10 configure to perform the proposed method. The control arrangement 10 is for example located at premises provided or controlled by the cell manufacturer.

The control arrangement 10 comprises at least one processor 11 and memory 12. In general, the electronic user device 2, is configured to perform all embodiments of the method described in connection to FIG. 6. This might e.g., be achieved by the processor 11 executing software stored in the memory 202.

More specifically, the control arrangement 10 is configured to obtain manufacturing data $d_{man}$ recorded during cell manufacturing and associated with the secondary cells 1. The control arrangement 10 is also configured to, upon the secondary cells 1 being fully assembled, causing a scanner 51 (FIG. 5) to generate scanning data $d_{scan}$ by scanning an inside of, at least a subset of the secondary cells 1 using a radiation-based scanning technology, and determine cell quality of the individual secondary cells using a prediction algorithm that predicts cell quality based on obtained manufacturing data $d_{prod}$ and/or the generated scanning data $d_{scan}$. Furthermore, the control arrangement 10 is configured to cause a testing device (e.g. a cycler 30) to perform additional testing on a selection of the scanned secondary cells 1, verify, based on the additional testing, that accuracy of the prediction algorithm meets predefined accuracy requirements that must be met in order for the determined cell quality to form a basis for production testing, and to evaluate cell health of the individual secondary cells 1 based on the cell quality determined using the prediction algorithm.

The proposed technique has been described with reference to lithium-ion cells, but it should be appreciated that method for other types of cells including cells made from solid state materials, such as graphene. Such cells are expected to be more commonly used in the future.

The terminology used in the description of the embodiments as illustrated in the accompanying drawings is not intended to be limiting of the described method, control arrangement or computer program. Various changes, substitutions and/or alterations may be made, without departing from disclosure embodiments as defined by the appended claims.

The term "or" as used herein, is to be interpreted as a mathematical OR, i.e., as an inclusive disjunction; not as a mathematical exclusive OR (XOR), unless expressly stated otherwise. In addition, the singular forms "a", "an" and "the" are to be interpreted as "at least one", thus also possibly comprising a plurality of entities of the same kind, unless expressly stated otherwise. It will be further understood that the terms "includes", "comprises", "including" and/or "comprising", specifies the presence of stated features, actions, integers, steps, operations, elements, and/or components, but do not preclude the presence or addition of one or more other features, actions, integers, steps, operations, elements, components, and/or groups thereof. A single unit such as e.g., a processor may fulfil the functions of several items recited in the claims.

The invention claimed is:

1. A method for evaluating cell health of secondary cells (1) in mass scale production testing, the method comprising:

obtaining (S1) manufacturing data ($d_{man}$) recorded during cell manufacturing and associated with the secondary cells (1), and upon the secondary cells (1) being fully assembled, generating (S2) scanning data ($d_{scan}$) by scanning an inside of, at least a subset of the secondary cells (1) using a radiation-based scanning technology, determining (S3) cell quality of the individual secondary cells using a prediction algorithm that predicts cell quality based on obtained manufacturing data ($d_{prod}$) and/or the generated scanning data ($d_{scan}$), performing (S4) additional testing using an alternative testing technology having higher reliability than the radiation-based scanning technology, only on a selection of the scanned secondary cells (1), verifying (S5), based on the additional testing, that accuracy of the prediction algorithm meets predefined accuracy requirements that must be met in order for the determined cell quality to form a basis for production testing, and evaluating (S7) cell health of the individual secondary cells (1) based on the cell quality determined using the prediction algorithm.

2. The method of claim 1, wherein the prediction algorithm comprises one or more of:

criteria applicable to identify, based on the scanning data, internal changes in secondary cells associated with cell degradation and/or different types of errors, and criteria applicable to detect, based on the manufacturing data ($d_{man}$), potential manufacturing deviations associated with cell degradation and/or different types of errors.

3. The method of claim 2, wherein the obtained manufacturing data ($d_{man}$) comprises data collected during Formation and Ageing, F&A, slurry production and/or during electrode coating.

4. The method of claim 1, wherein the scanning is performed a predetermined time after cells (1) being fully formatted.

5. The method of claim 1, wherein the scanning is performed by a scanner (51) arranged at a production line.

6. The method according to claim 5, wherein cells (1) selected to undergo additional testing are side streamed on another line, different from the production line.

7. The method of claim 1, wherein the selection of secondary cells (1) selected for additional testing comprises:

high performing cells having scanning data ($d_{scan}$) exceeding an acceptance level for passing with a certain margin, and/or outliers having scanning data ($d_{scan}$) within a risk interval just above the acceptance level for passing, failing cells having scanning data ($d_{scan}$) failing to meet the acceptance level for passing with a certain margin, and suspicious cells having deviating manufacturing data ($d_{man}$).

8. The method of claim 1, wherein the verifying (S5) comprises comparing determined cell quality with cell quality determined based on the additional testing.

9. The method of claim 1, wherein the method further comprises:

updating (S8) the prediction algorithm based on cell quality.

10. The method of claim 1, wherein the verifying (S5) comprises investigating consequences of deviations in the obtained (S1) manufacturing data.

11. The method of claim 1, wherein the radiation-based scanning technology comprises sound, such as ultrasound or echo sound.

12. The method of claim 1, further comprising:

developing (S0) the prediction algorithm based on results from additional testing of secondary cells of different cell quality.

13. The method of claim 1, wherein the additional testing comprises one or more of; cell cycling, short circuit testing, over charging testing, nail penetration testing, thermal testing, or CT-scanning.

14. A control arrangement (10) configured to perform the method according to claim 1.

*    *    *    *    *